United States Patent [19]

Takada

[11] Patent Number: 4,545,851
[45] Date of Patent: Oct. 8, 1985

[54] ETCHING METHOD FOR SEMICONDUCTOR DEVICES

[75] Inventor: Tadakazu Takada, Kawasaki, Japan

[73] Assignee: Fujitsu Limited, Kawasaki, Japan

[21] Appl. No.: 605,908

[22] Filed: May 1, 1984

[30] Foreign Application Priority Data

May 9, 1983 [JP] Japan .................................. 58-80503

[51] Int. Cl.$^4$ .................. H01L 21/306; B44C 1/22; C03C 15/00; C23F 1/02
[52] U.S. Cl. ................. 156/643; 156/644; 156/646; 156/653; 156/656; 156/657; 156/659.1; 156/662; 156/345; 204/192 E; 427/38; 427/90; 430/314
[58] Field of Search ............. 156/643, 644, 646, 652, 156/653, 656, 657, 659.1, 662, 345; 252/79.1; 204/192 EC, 192 E; 427/38, 39, 88–90; 430/313, 314, 315, 317

[56] References Cited

U.S. PATENT DOCUMENTS 3,986,912 10/1976 Alcorn et al. .................. 156/644 X
4,354,897 10/1982 Nakajima ...................... 156/463

OTHER PUBLICATIONS

"Glow Discharge Processes", Brian Chapman, John Wiley & Sons, 1980, pp. v–vii, ix–xv and 326–327.

Primary Examiner—William A. Powell
Attorney, Agent, or Firm—Staas & Halsey

[57] ABSTRACT

An etching method for fabricating a contact hole in an insulating layer between multi-layered wiring layers of a semiconductor device. Etching is performed by chemical dry etching, in which the plasma of the etchant gas is formed in a separate chamber and fed to the etching chamber. The substrate is covered with a photo resist mask which includes a pattern hole and is heated, from the side opposite the mask, up to a softening temperature of the photo resist. The edge of the photo resist mask surrounding the pattern hole gradually rolls up as side etching proceeds under the edge of the photo resist mask with the result that the side walls of the contact hole are tapered. Consequently, the subsequently formed wiring layer formed thereon has good step coverage over the side walls of the contact hole, so that discontinuities and breakage of the wiring layer is prevented and the reliability and yield of the manufacturing process are improved.

10 Claims, 7 Drawing Figures

ETCHING METHOD FOR SEMICONDUCTOR DEVICES

BACKGROUND OF THE INVENTION

This invention relates to an etching method for semiconductor devices, more particularly to an etching process for fabricating contact holes in an insulating layer separating two metallization layers of an integrated circuit (IC).

In a process for fabricating multi-layered wirings on semiconductor devices, it is important to obtain good "step coverage" in order to manufacture devices having high reliability. Good step coverage results in continuously covering a stepped portion with a layer covering the step. Step coverage is especially important in IC processing technology to fabricate contact wiring between the circuits fabricated on different levels or surface heights. The use of such wirings between different surface levels or between multi-wiring layers has increased with the use of large scale integrated circuits (LSI), and has increased further as the scale of integration has increased. Contact holes, through which wiring between layers are passed, are typical examples of such stepped portions.

The thickness of a conductive layer (generally aluminum film) formed on a surface having a step becomes thin at the portion covering the step, especially when the step has a sharp edge, and the wiring often breaks at the stepped portion. Therefore, it is essential to maintain a constant thickness of the conductive layer, that is, to obtain good step coverage, in order to manufacture IC's of high reliability.

In order to obtain good step coverage, usually the stepped portion is tapered or inclined. Tapering of the step is done via an etching process. For example, FIG. 1(a) is a cross section of a contact hole fabricated using a prior art plasma etching process. In FIG. 1(a), an aluminum layer 1 of a first (or lowest) wiring layer is fabricated over a semiconductor substrate (not shown) and is covered with an insulating layer 2 on which a second wiring layer should be fabricated (not shown). This insulating layer 2 is covered with a photo resist mask 3, which has a pattern including a contact hole 4 fabricated by photolithographic technology. Then the substrate is etched using plasma etching, usually by a mixture of tetrafluoromethane (CF$_4$) and oxygen (O$_2$) as the etchant gas. During this plasma etching process, the portion of the insulating layer 2, which is not covered by the photo resist mask 3, is etched off and the contact hole 4 is made. During this plasma etching process, as depicted in FIG. 1(a), the insulating layer 2 is also side etched, and an under-cut portion 5 is made.

This under-cut portion 5 is tapered or inclined naturally and it is a desirable structure from the view point of providing good step coverage. The prior art technology depends on this under-cut 5, but often suffers from an overhang of the side-etched insulating layer 2. If the etching temperature is raised in order to increase the etching rate, the photo resist mask 3 is heated by plasma and softened, accordingly, it often tilts down as illustrated in FIG. 1(b). If such a tilt of the photo resist 3 occurs during the middle of the etching process and the etching process is continued, the etched insulating layer 2 has an overhang 6, as depicted in FIG. 1(b).

Even if the etching rate is suppressed to a low rate in order to avoid the heating of the photo resist 3, the overhang 6 may still remain. Returning to FIG. 1(a), though the side wall 5 of the contact hole 4 at the bottom part of the under-cut 5 is inclined, the slope of the side wall at the upper part of the under-cut 5 (close to the photo resist 3) is very steep. In addition, sometimes it also has an overhang, because the insulating layer 2 adjacent to the back side of the resist 3 is not etched completely. The prior art etching process, therefore, can not completely avoid overhangs and thus provides poor step coverage, with the result that IC reliability often suffers.

There is a trend of shifting the etching process from batch processing to continuous processing on a conveyor system, to increase production. In batch processing, semiconductor slices (substrates) are processed in a batch, and a slow etching rate does not greatly effect the total processing speed. However, in a continuous processing system, the etching speed is an important factor in the production speed and a high etching rate is required for such continuous production systems.

SUMMARY OF THE INVENTION

An object of the present invention, therefore, is to provide an etching method for a semiconductor device which can provide good step coverage for multi-layered wiring.

Another object of the present invention is to provide an etching method which does not heat up the photo resist mask, and has a high etching speed.

Yet another object of the present invention is to prevent the formation of an overhang at a stepped portion.

A further object of the present invention is to avoid sharp edges on a contact hole formed during the etching of a semiconductor device.

A still further object of the present invention is to increase the speed of continuous processing of semiconductor devices.

The foregoing objects are accomplished by using a dry etching process, especially a chemical dry etching process, on the substrate, which is heated from the side opposite the photo resist mask. The plasma in a chemical dry etching process does not require a temperature high enough to soften the photo resist mask. Since the substrate is heated from its back side as the etching proceeds, a portion of the photo resist mask along the edge of a contact hole pattern rolls upward due to the difference of thermal expansion between the upper and lower side of the photo resist mask. Side etching occurs under the raised portion of the photo resist mask, and the side wall of the contact hole is tapered, thus providing good step coverage for the hole. The chemical dry etching process has a high etching speed and it is applicable to continuous processing on a conveyor system.

These objects, together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1A:
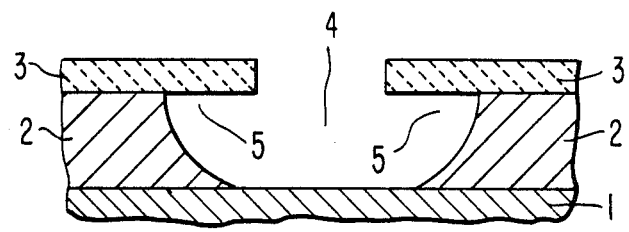
FIG. 1(a) is a cross section of a contact hole fabricated using prior art technology.
Figure 1B:
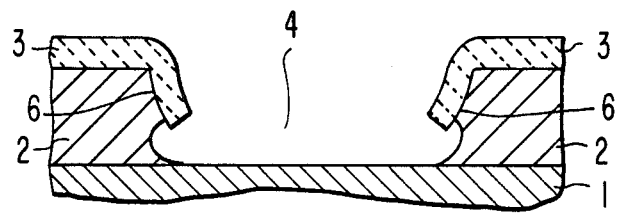
FIG. 1(b) is a cross section illustrating how the overhang of a contact hole is formed.

As previously mentioned, in a conventional plasma etching process, the photo resist mask is heated up by the plasma. The softening point of ordinary photo resist is apporoximately 120° C. for a positive resist (for example, OFPR series sold by TOKYO OHKA KOGYO), and 160° C. for a negative photo resist (for example, OMR series, sold by TOKYO OHKA KOGYO). In the conventional plasma etching process, when the etching rate is increased, the photo resist mask is heated to a temperature above the softening point. Accordingly, the mask tilts down as depicted in FIG. 1(b), resulting in an overhang 6 on the side wall of the contact hole 4 and poor step coverage.

Figure 2A:
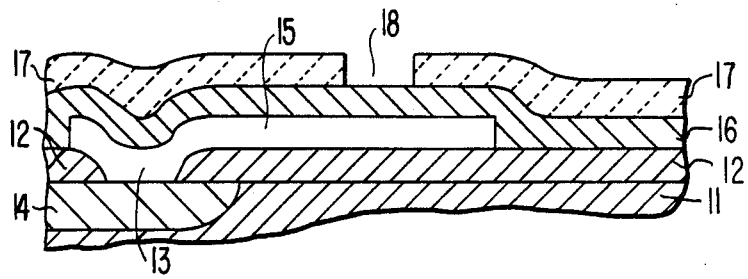
FIGS. 2(a)-(d) illustrate cross-sectional views of the process for making a contact hole in an insulating layer between multi-layered wiring layers of a semiconductor device according to the present invention.

The present invention uses a low temperature plasma, and heat is applied to the substrate from the side opposite the photo resist mask, in order to roll up the edge of the photo resist mask close to the side wall of the contact hole. FIG. 2 illustrates the etching process according to the present invention. The etching process of the present invention starts with known semiconductor devices, using a substrate which has already been processed by known methods to fabricate the elements of the devices, such as bipolar or MIS (Metal Insulator Semiconductor) structure devices. A first wiring layer 15 (lower wiring layer) and an insulating layer 16 covering the first wiring layer 15 are fabricated on the surface of the substrate before the process of the present invention begins. FIG. 2(a) is a cross section of a semiconductor device which is ready for etching, at a portion close to where the contact hold 19 will be made. The preparation of the substrate 11 for etching according to the present invention will be described briefly.

In FIG. 2(a), the substrate 11, in which the semiconductor elements such as transistors are already fabricated, has a surface generally coated with a passivation film (not shown), such as a silicon dioxide ($SiO_2$) film. A phospho-silicate glass (PSG) layer 12 is deposited using known chemical vapor deposition (CVD), over the substrate 11. In the lower insulating layer 12 which is usually a $SiO_2$ layer and a PSG layer, a contact hole 13 is made for electrode 14, using known reactive ion etching (RIE) and photo-lithography, using, for example, tetrafluoromethane ($CF_4$) as the etchant for the RIE. The edge of the contact hole 13 is smoothed and tapered using a conventional reflow process. Reflowing smooths the etched surface of the PSG layer 12 by heating the substrate 11 up to about 900° C. for about 30 minutes in dry oxygen. Thus, the edge of the contact hole 13 is rounded as illustrated in FIG. 2(a). However, the reflowing process can not be applied to the second insulating layer 16, or other higher insulating layers, because the temperature is too high and the already formed wiring layers will be damaged.

Following the reflowing process for the contact hole 13, an aluminum film 15 is deposited over the lower insulating layer 12 using known plasma sputtering, for example. This aluminum film 15 is patterned to form a first wiring layer 15 using known photo-lithography and reactive ion etching using a gas containing chlorine as etchant. The first wiring layer 15 contacting an active area 14 of the semiconductor element is thereby fabricated. Sometimes a polycrystalline silicon (poly-silicon) layer (not shown) is formed under the first wiring layer 15.

Then, a PSG insulating layer 16 of approximately 1 $\mu$m in thickness, for instance, is formed using a known chemical vapor deposition process, over the first wiring layer 15. The PSG insulating layer 16 is coated with a photo resist film 17, for example, a positive photo resist film 1.5 $\mu$m thick. A contact hole pattern 18 is formed in the photo resist film 17 by known photo-lithography. The above described processes are all conventional processes for fabricating semiconductor devices and any modification or other process for fabricating a semiconductor device having multi-layered wiring may be used instead.

Figure 3:
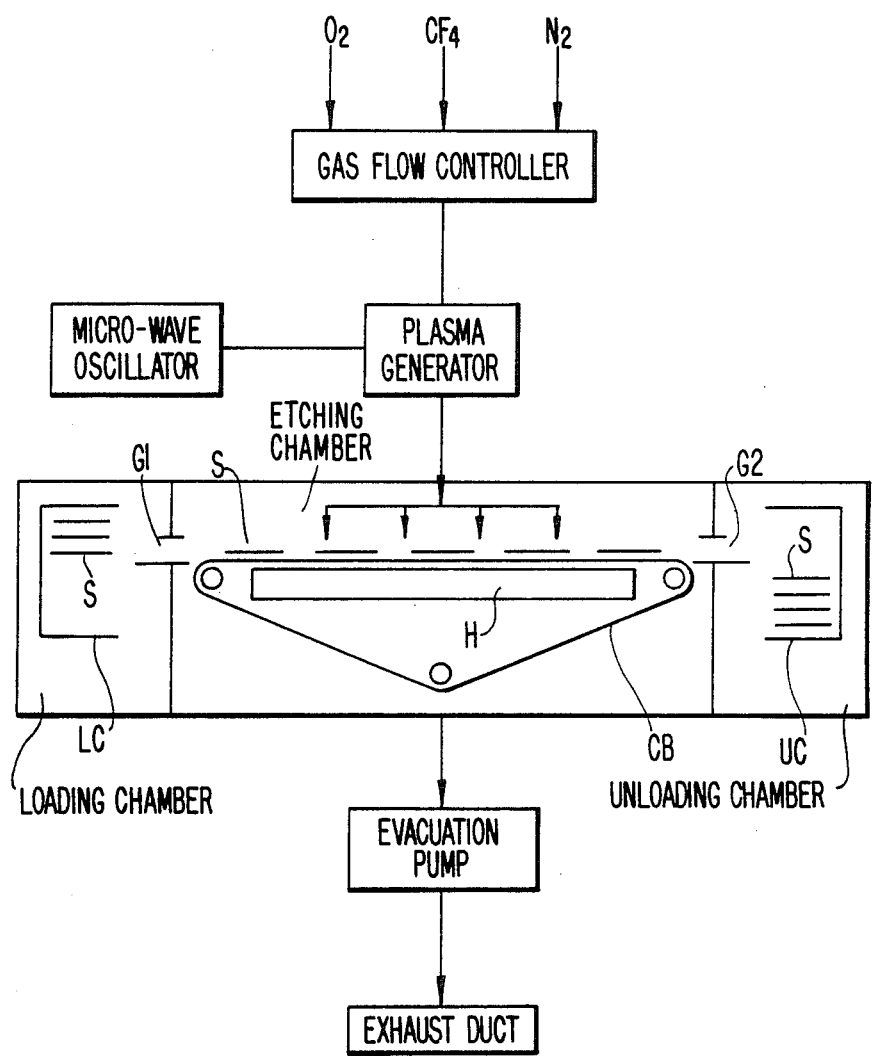
FIG. 3 illustrates an embodiment of an etching system using a process according to the present invention which is applicable to etching semiconductor slices carried continuously on a conveyor system.

Next, the etching process according to the present invention is performed on the substrate 11 prepared in the above-described manner. FIG. 3 is a block diagram of an embodiment of a chemical dry etching device employing the present invention. The etching is performed slice (substrate) by slice on a conveyor system. As illustrated in FIG. 3, a plurality of slices S are loaded on a loading cassette LC, and inserted into the loading chamber. In the loading chamber air is pumped out and pressure therein is equalized with the pressure in the etching chamber. Then, the slices S are loaded one by one onto a conveyor belt CB, through the gate G1 which separates the loading and etching chambers. The apparatus for such operations is not shown in FIG. 3 for the sake of simplicity. Any known conventional apparatus suitable for the process may be used.

The slices S are heated from the bottom by a heater H placed below the conveyor belt CB and etched by plasma reactive gas. The etching process will be described in detail later. After the etching is finished, the slices S are unloaded from the conveyor belt CB and loaded onto an unloading cassette UC by a suitable apparatus (not shown). When the unloading cassette UC is filled with slices S, the gate G2 separates the unloading chamber from the etching chamber and the etched slices S are removed from the unloading chamber after the gas in the unloading chamber is replaced with air.

During the loading and unloading of the cassette into the loading chamber or from the unloading chamber, the etching process is interrupted. But it will be clear to one skilled in the art, that a slight modification of the equipment illustrated in FIG. 3 makes it possible to continue the etching process while the cassettes are being loaded or unloaded. For example, adding one more loading chamber and a gate to the left side of the loading chamber, and one more unloading chamber and a gate to the right side of the unloading chamber in FIG. 3, it is possible to load or unload the cassettes to or from these newly added chambers and prepare the gas pressure while the illustrated chambers are in operation. When one loading cassette or unloading cassette is empty or filled with slices, respectively, it may be replaced with a new one in the additional loading or unloading chamber without disturbing the operation being performed in the etching chamber. Many other modifications of the above process and apparatus used in the process which may occur to one skilled in the art are within the scope of the invention.

Figure 2B:
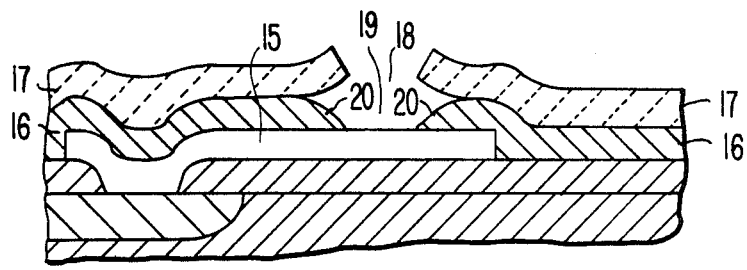

The selective etching of the insulating layer 16 to fabricate a contact hole 19 in the insulating layer 16 is performed using a chemical dry etching method and the photo resist mask 17 as illustrated in FIG. 2(b). The etchant gas can be a mixture of tetrafluoromethane (CF$_4$) and oxygen (O$_2$), for example. The etchant gas flow is controlled by a gas flow controller (See FIG. 3). The mixing ratio for CF$_4$ and O$_2$ is 80:20 in flow rate, for example. As indicated in FIG. 3, the etchant gas mixture is fed into a plasma generator chamber, where the etchant gas is excited and activated by microwave energy, and a plasma of the etchant gas is generated. Usually, the power of the microwave energy is about 1 kW and the frequency is about 2.45 GHz. The microwave energy is generated by a microwave oscillator and fed into the plasma generator chamber. The pressure in the etching chamber is evacuated by a pump to keep a constant pressure of 0.3 Torr, for example. The plasma is then fed into the etching chamber, and etches the insulating layer 16.

In the prior art, plasma etching is usually performed in a chamber where a slice S is inserted, etchant gas is fed into the chamber and microwave energy is fed into the chamber. Therefore, the substrates are heated by the microwave energy and the heated gas which is not activated to plasma. According to the present invention, however, plasma generation and etching occur in separate chambers, in the plasma generator and the etching chamber, respectively. As a result, the substrates are not heated as much as in the conventional plasma etching method. The cooler plasma etching method is well known in the art and is called chemical dry etching. Further details relating to plasma dry etching are disclosed in Glow Discharge Processes, published by Brain Chapman in 1980; John Wiley & Sons, Inc., N.Y. U.S.A., incorporated herein by reference.

In the etching chamber illustrated in FIG. 3, the substrates S are heated from the bottom by a heater H placed below the conveyor belt CB. The temperature is controlled to between 120° and 160° C. when a positive photo resist is used for the mask 17 (FIG. 2(a)). This is the temperature at which the positive photo resist softens. If a negative photo resist is used for the mask 17, the temperature is increased to between 160° and 200° C. and the negative photo resist is softened.

Figure 2C:
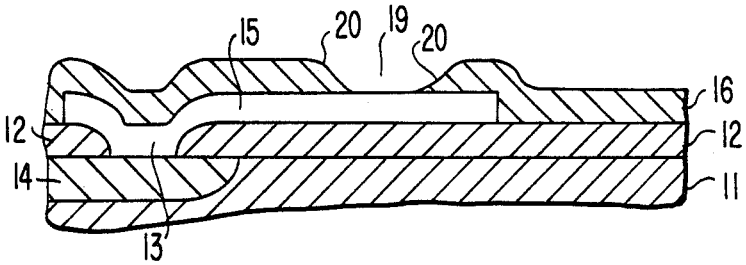

At the same time, the chemical dry etching proceeds from the upper surface of the substrate (PSG insulation layer 16) through the hole 18 of the photo resist film 17. The etching rate is approximately 3,000 Angstroms/minute. During this etching, it was found by the inventor that the edge of the photo resist layer 17, is rolled up gradually as the side etching proceeds, as depicted in FIG. 2(b). This occurs, I assume, because the temperature of the upper surface of the photo resist film 17 is lower than that of the lower surface, because the effective temperature of the plasma is lower than that of the PSG insulation layer 16, and due to the difference in thermal expansion of the upper and lower surfaces of the photo resist film 17, the film 17 rolls up. It is difficult to measure the temperature of plasma and therefore the above explanation is theoretical only, nevertheless, this observed phenomenon is preferable for tapering the side wall 20 of the etched hole 19. As illustrated in FIG. 2(b), the under-cut and side etch widens, as the etching toward the bottom of the etched hole 19 proceeds. Thus, the etched contact hole 19 is naturally tapered or gently sloped, as illustrated in FIG. 2 (c). After the etching is finished, the photo resist mask 17 is removed as illustrated in FIG. 2(c). The shape of the contact hole 19 is superior for attaining good step coverage.

Figure 2D:
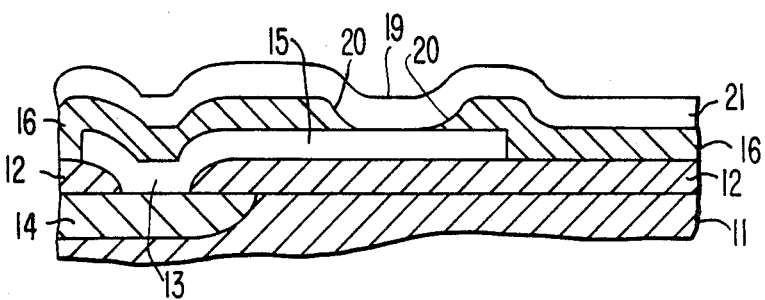

After the contact hole 19 is fabricated, the upper wiring layer 21 and surface protection layer (not shown) are deposited to finish the semiconductor device. These layers are formed using processes similar to known semiconductor processes, and any conventional process can be applied. One example of such a process will be described briefly. As illustrated in FIG. 2(d), when the contact hole fabrication is completed, an aluminum film 21 of approximately 1.5 μm is formed over the previous layers by plasma sputtering, for example. Then, using a photo-lithographic process, the aluminum film 21 is patterned to form the second (upper) wiring layer 21, by reactive ion etching (RIE), for example, using a gas containing chlorine (Cl$_2$) as an etchant. The upper wiring layer 21 is thereby connected to the first wiring layer 15 through the contact hole 19.

Since the side wall 20 of the contact hole 19 is gently tapered as described before, the step coverage of the upper aluminum layer 21 is very good. Consequently, no discontinuities appear in the aluminum film of the upper wiring layer 21 as it passes over the edge of the contact hole 19. After this process, the surface of the substrate is coated with an insulation layer (not shown) for surface protection, and the semiconductor device fabrication is finished.

In the above discussion, the insulating layer 16 between the conductive layers (wiring layers) 12 and 21 was assumed to be a phospho-silicate glass (PSG), but it can be any kind of insulating layer, for example a silicon dioxide (SiO$_2$) layer formed by chemical vapor deposition (CVD) or silicon nitride (Si$_3$N$_4$) film formed by a plasma deposition process. The wiring layers 12 and 21 may be of any kind, for example poly-crystalline silicon, or metal silicide, etc. Also, the material of the semiconductor substrate is not limited to silicon, but may be germanium or a compound semiconductor, for example. In addition, the etching process has been described with respect to the fabrication of a contact hole. However, it would be obvious to those skilled in the art that the etching process according to the present invention can be applied to etching any part of a semiconductor device.

As has been described above, by applying the etching process of the present invention, the side walls 20 of a contact hole 19 in an insulating layer 16 between two conducting layers 12 and 21 are gently tapered or sloped. Accordingly, the step coverage over the edge of the contact hole 19 is improved and disconnection at the contact hole 19 is avoided, consequently, the reliability of the semiconductor device and the production yield are increased.

The many features and advantages of the present invention are apparent from the detailed specification, and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation illustrated and described, accordingly, all suitable modifications and equivalents may be resorted to, falling within the scope and spirit of the invention.

What is claimed is:

1. An etching method for fabricating a semiconductor device having first and second surfaces on opposite sides, said method comprising the steps of:
   (a) forming a layer to be etched on the first surface of the device;

(b) forming a photo resist mask having a predetermined pattern on the layer and leaving a portion of the layer exposed;

(c) heating the second surface of the device to a first temperature; and (d) supplying an active etchant gas at a second temperature lower than the first temperature and etching the portion of the layer exposed.

2. An etching method as recited in claim 1, wherein the first temperature is sufficient to soften the photo resist mask.

3. An etching method as recited in claim 1, further comprising the steps of:

(e) placing the device in an etching chamber prior to step (c); and (f) generating a plasma etchant gas in a chamber separate from the etching chamber, and wherein step (d) comprises supplying the plasma to the etching chamber as the active etchant gas.

4. An etching method as recited in claim 1, wherein the layer to be etched includes an insulating layer and step (d) comprises forming a contact hole through the portion of the layer exposed, and said etching method further comprises the steps of:

(e) forming a first wiring layer on the first surface of the substrate prior to step (a); and (f) forming an upper wiring layer on the insulating layer to contact the first wiring layer through the contact hole.

5. An etching method as recited in claim 1, wherein the photo resist mask comprises a positive photo resist film and the first temperature is between 120° and 160° C.

6. An etching method as recited in claim 1, wherein the photo resist mask comprises a negative photo resist film and the first temperature is between 160° and 200° C.

7. An etching method as recited in claim 1, wherein the active etchant gas comprises a mixture of tetrafluoromethane and oxygen.

8. An etching method as recited in claim 1, wherein the photo resist mask has an edge surrounding the portion of the layer which is exposed, and wherein step (d) comprises side etching and step (c) comprises gradually rolling up the edge of the photo resist mask, steps (c) and (d) occurring at least partially concurrently where the side etching proceeds as the edge of the photo resist mask is rolled up.

9. A method of etching a semiconductor device having a resist mask on a first side with a hole therethrough, comprising the steps of:

(a) heating a second side of the semiconductor device opposite to the first side; and (b) etching the first side of the semiconductor device through the hole with a dry etching plasma gas.

10. A method as recited in claim 9, wherein said heating in step (a) is to a first temperature sufficient to soften the resist mask and the dry etching plasma gas is supplied at a second temperature lower than the first temperature.

* * * * *